United States Patent
Klingner et al.

(10) Patent No.: US 8,691,658 B2
(45) Date of Patent: Apr. 8, 2014

(54) ORIENTATION OF AN ELECTRONIC CMOS STRUCTURE WITH RESPECT TO A BURIED STRUCTURE IN THE CASE OF A BONDED AND THINNED-BACK STACK OF SEMICONDUCTOR WAFERS

(75) Inventors: Holger Klingner, Erfurt (DE); Jens Ungelenk, Bad Berka (DE)

(73) Assignee: X-Fab Semiconductor Foundries AG, Erfurt (DE)

( * ) Notice: Subject to any disclaimer, the term of this patent is extended or adjusted under 35 U.S.C. 154(b) by 112 days.

(21) Appl. No.: 13/055,884

(22) PCT Filed: Jul. 27, 2009

(86) PCT No.: PCT/IB2009/053268
§ 371 (c)(1),
(2), (4) Date: May 26, 2011

(87) PCT Pub. No.: WO2010/013194
PCT Pub. Date: Feb. 4, 2010

(65) Prior Publication Data
US 2011/0250732 A1 Oct. 13, 2011

(30) Foreign Application Priority Data
Jul. 26, 2008 (DE) .......................... 10 2008 035 055

(51) Int. Cl.
*H01L 21/76* (2006.01)
(52) U.S. Cl.
USPC .................... 438/401; 438/456; 257/E21.536
(58) Field of Classification Search
USPC .................................. 438/401, 455, 456, 459
See application file for complete search history.

(56) References Cited

U.S. PATENT DOCUMENTS 5,095,401 A * 3/1992 Zavracky et al. .......... 361/283.4
6,451,668 B1 9/2002 Neumeier et al.
(Continued)

FOREIGN PATENT DOCUMENTS

DE 42 23 455 10/1993
DE 199 13 612 12/1999
(Continued)

OTHER PUBLICATIONS

International Search Report for International Patent Application No. PCT/IB2009/053268, mailed Mar. 10, 2010.
(Continued)

*Primary Examiner* — Reema Patel
(74) *Attorney, Agent, or Firm* — Hunton & Williams LLP

(57) ABSTRACT

A method for aligning an electronic CMOS structure with respect to a buried structure in the case of a bonded and thinned back stack of semiconductor wafers. The method for aligning the electronic CMOS structure may include forming alignment marks in the process of fabricating the structure to be buried on a front side, which is used for bonding of the semiconductor wafer, which includes the structure to be buried. The alignment marks may be formed on the edge of the semiconductor wafer. The method for aligning the electronic CMOS structure may include providing a cover wafer with first thinned portions of the wafer thickness provided from the bonding side at positions corresponding to positions of the alignment marks. After the thinning of the cover wafer a plan view of the alignment mark is obtained after the wafer bonding that initially results in a burying of the structures, wherein subsequently the resulting wafer stack is thinned to a certain degree with respect to the cover wafer, thereby making visible the at least one alignment mark, and by means of the alignment mark masks of method steps for fabricating the electronic structure on the surface of the thinned cover wafer are aligned.

19 Claims, 2 Drawing Sheets

(56) References Cited

U.S. PATENT DOCUMENTS

| | | |
|---|---|---|
| 2005/0013019 A1 | 1/2005 | Tseng et al. |
| 2005/0023647 A1 | 2/2005 | Nemoto et al. |
| 2006/0038260 A1 | 2/2006 | Nemoto et al. |

FOREIGN PATENT DOCUMENTS

| | | |
|---|---|---|
| DE | 10 2004 006 494 | 1/2005 |
| EP | 0 921 555 | 4/1998 |
| EP | 0 921 555 | 6/1999 |
| EP | 0 989 596 | 3/2000 |
| EP | 1 115 153 | 7/2001 |
| WO | WO 94/14627 | 7/1994 |
| WO | WO 2005/038903 | 4/2005 |

OTHER PUBLICATIONS

International Preliminary Report on Patentability with Written Opinion for International Patent Application No. PCT/IB2009/053268, mailed Feb. 17, 2011.

International Search Report for PCT/IB2009/053268; mailed Mar. 10, 2010; 5 pages.

\* cited by examiner

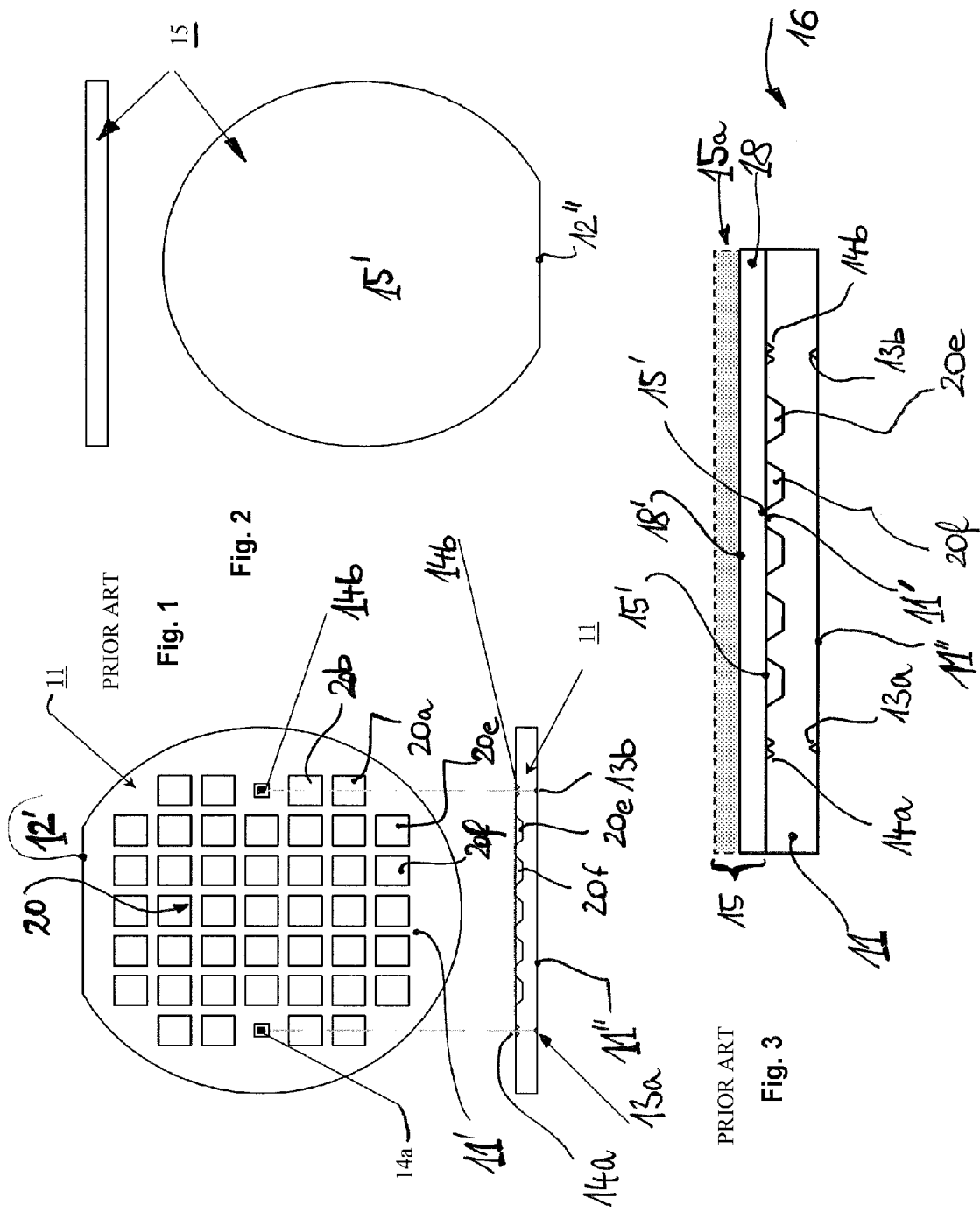

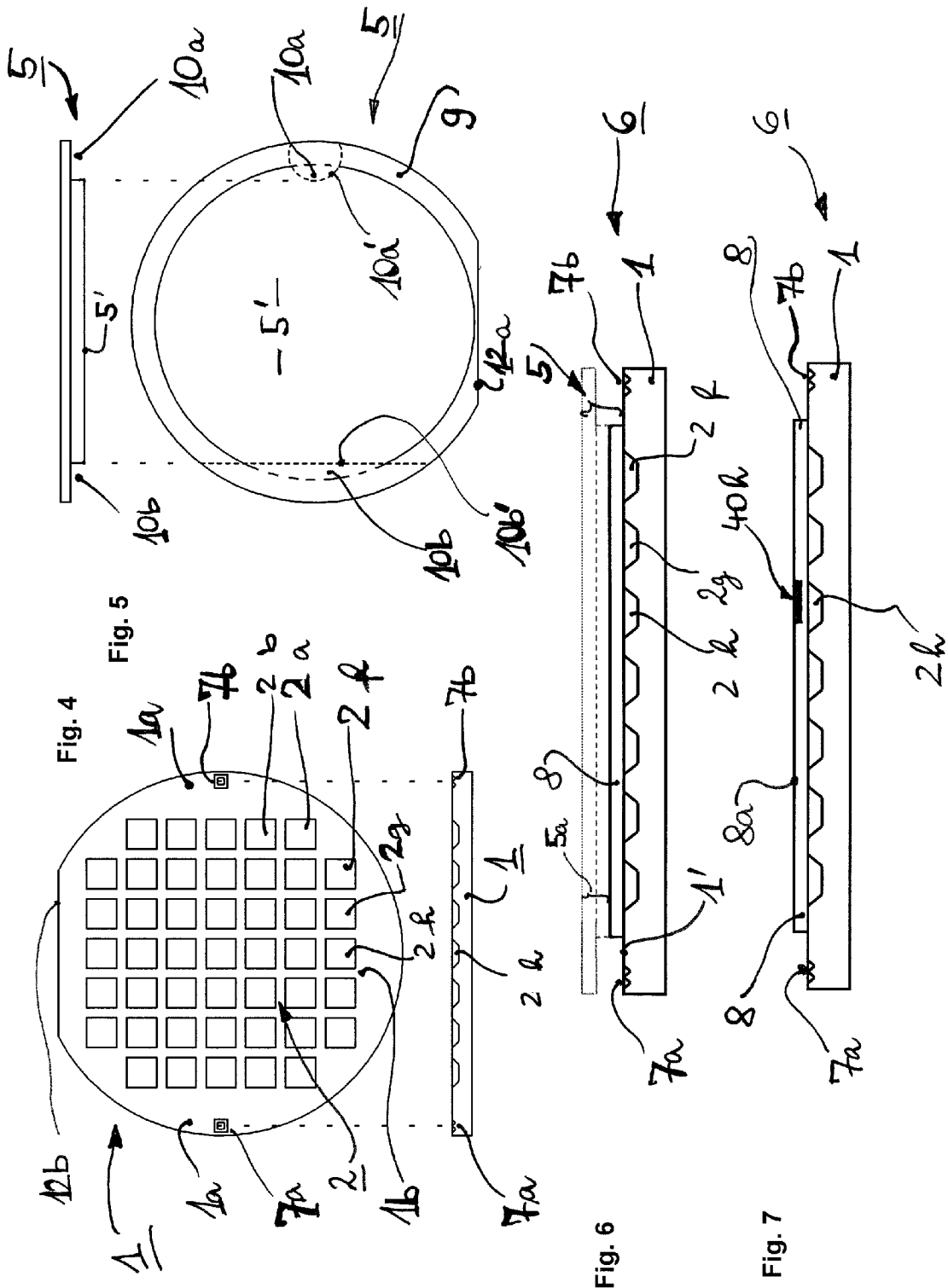

ORIENTATION OF AN ELECTRONIC CMOS STRUCTURE WITH RESPECT TO A BURIED STRUCTURE IN THE CASE OF A BONDED AND THINNED-BACK STACK OF SEMICONDUCTOR WAFERS

CROSS-REFERENCE TO RELATED APPLICATIONS

The application is a U.S. National Stage Application of International Application of PCT/IB2009/053268 filed Jul. 27, 2009, which claims the benefit of German Patent Application No. 10 2008 035 055.9 filed Jul. 26, 2008, the disclosures of which are herein incorporated by reference in their entireties.

FIELD OF THE DISCLOSURE

The invention is based on a method for orienting or aligning of an electronic CMOS structure with respect to a buried structure for a bonded and thinned-back stack of semiconductor wafers.

In the process of fabricating the structures to be buried on the front side of the semiconductor wafer, which is used for the bonding process and which bears the structure to be buried, alignment marks are formed. Bonding of a cover wafer is accomplished by thinning the wafer thickness from the bonding side at locations that correspond in their positions to the alignment marks such that visibility as a top view of the alignment mark is achieved after the wafer bonding, by which initially the structures are buried, and after the thinning-back of the cover wafer. To this end, the wafer stack obtained by the bonding process is—with respect to the cover wafer—thinned to a certain measure, thereby making the alignment marks visible. By means of the alignment marks the masks are aligned, which used for the process steps for fabricating the electronic structure on the surface of the thinned cover wafer.

BACKGROUND OF THE DISCLOSURE

In the manufacturing process of a known sensor, for instance an absolute pressure sensor, cf. FIGS. 1 and 2, two semiconductor wafers or simply wafers are joined to each other in a laminar manner by bonding. This is achieved such that recesses (cavities) formed in the front side of the first semiconductor wafer as the cavities of a cavity wafer are covered and hermetically sealed under vacuum conditions by means of the second semiconductor wafer acting as a cover wafer. By means of grinding, polishing or etching of the stack formed by the bonding process the bonded cover wafer is thinned into a membrane of defined thickness. In this state, at least one electronic structure has to be implemented into the it) semiconductor wafer surface of the membrane obtained by the thinning process in order to evaluate pressure dependent deformations of the membrane; the membrane's orientation has to be in defined relationship to the geometry of the cavities that are no longer visible.

To this end, according to well-established techniques rear side alignment marks (on the wafer) are provided on the rear side of the cavity wafer in a first step of the process flow, which alignment marks are then used to align the mask for the cavities by alignment of the front side to the rear side (as "front to back side alignment") by means of alignment marks on the mask. In this way, front side alignment marks are obtained on the wafer, which are aligned to the wafer alignment marks on the rear side. During the bonding process of the cover wafer the front side alignment marks are covered. After the bonding and thinning processes the CMOS structure has to be positioned by means of the rear side alignment marks on the wafer via the masks defining the CMOS structure. Only then the CMOS structure is in a defined position with respect to the structure comprised of several cavities that is no longer visible.

This method is disadvantageous in that the cavity wafer has to be manipulated at its front side (in the sense of handled) for the generation of the rear side marks so that damage, for instance imprints of a chuck or scratches may occur. Also, the achievable precision is lowered due to the necessity of a double alignment of front side to rear side (a respective mask to the rear side marks).

According to DE 42 23 455 A1 (Mitsubishi Denki) a semiconductor pressure sensor (sensor) comprises a first silicon substrate and a second silicon substrate with a primary surface on which is formed a device having diffused resistors and a diffused wiring system. A secondary surface that is bonded or joined to a primary surface of the first silicon substrate comprises an intermediate insulation layer between the primary surface of the first silicon substrate and the secondary surface of the second silicon substrate, wherein the intermediate insulation layer includes a section that forms a vacuum chamber and there are sections provided which form alignment marks. Alignment is mark observation windows are formed on those sections of the second silicon substrate that correspond to the respective sections of the alignment marks, and a silicon oxide layer formed on the primary surface of the second silicon substrate is provided so as to protect the device and the alignment mark observation windows. This sensor comprises indentations or recesses in the shape of holes that are not positioned at the edge so that they have to correspond to the alignment marks of the lower wafer in a spatially precise manner. Openings in the vicinity of the useable wafer surface are associated with pronounced structuring issues, in particular an inhomogeneous stress load, the creation of "resist residues" and turbulences during rotating wet chemical processes.

According to DE 10 2004 006 494 A1 (Mitsubishi Denki) there is provided a semiconductor wafer having a front side surface that is a flat surface with a semiconductor circuit formed thereon and to which a carrier plate is attached. The rear side surface is partially removed in order to reduce the thickness thereof. A separation section is formed at an edge section of the semiconductor wafer, which separation section comprises a cavity that is deeper than the final thickness of the semiconductor wafer obtained partially by removing the rear side surface. The separation section has a length that extends from the flat surface gradually outwardly and that is greater than a total sum of the difference between the maximum and the minimum of the final tolerances of the diameter of the semiconductor wafer and of the carrier plate, which substantially has the same diameter as the semiconductor wafer. A maximum value of an alignment error is created between the semiconductor wafer and the carrier plate, wherein the alignment error is caused at the time of joining the components to each other. In this manner, a semiconductor wafer is to be provided in which a transport system for the semiconductor wafer may commonly be used prior to and after a carrier plate is attached to the semiconductor wafer and for which the final precision of the semiconductor wafer and the positioning or handling accuracy of the semiconductor wafer and the carrier plate are less critical. In this manner, enhanced efficiency during the fabrication of semiconductor devices is achieved.

US 2005/0013019 A1 (Tseng et al) discloses a method for photolithographic precision alignment of a wafer after bonding, wherein two cavities are formed on the rear side surface of the upper wafer at positions—corresponding to the alignment marks on the lower wafer. The depth of both cavities is deeper than that of the membrane structure. The upper wafer is then bonded to the lower wafer which already includes alignment marks and a microstructure. Thereafter, a thinning process is performed until the thickness of the upper wafer is less than the depth of the cavities so that the alignment marks may be joined with the cavities and may thus act as alignment marks for the exposure. Thus, structures are formed in the cover wafer and are opened by the thinning process and have to correspond to the alignment marks of the buried layer. Due to this fact the same difficulties are encountered in this case as in the above-identified DE 4223455 A1.

DE 19913612 C1 (Fraunhofer Society) relates to the fabrication of alignment structures for the photolithography processes in silicon wafers. The method for generating alignment structures in semiconductor substrates during the fabrication of devices includes the steps: providing a first substrate, on which is formed a first layer; patterning the first layer in order to form first portions that are necessary for the functioning of the devices; bonding the first substrate to a second substrate such that the first layer is positioned between the two substrates; thinning the first and second substrates down to a residual thickness. In this manner, the alignment structures are formed prior to bonding the first substrates to the second substrates in the form of portions which extend completely through the first layer—however not through the possibly thinned first substrate—and have an index of refraction that is different from the index of refraction of adjacent portions. The structures are based on local changes of the index of refraction or the damping within or below a thin silicon layer such that the topography of the wafer surface is not changed or affected. The alignment structures are visible for an exposure device in the red or infrared light range and in particular by using a dark field exposure.

SUMMARY OF THE DISCLOSURE

It is an object of the present invention to provide a method of the above-identified type such that the indicated disadvantages may be avoided, in particular an alignment of "front side to rear side" is to be avoided or the necessity of providing rear side alignment marks is to be avoided, while nevertheless an alignment of marks for the front side should be possible.

Alignment marks according to embodiments of the invention are formed at the edge of the semiconductor wafer and the thinned portions of the cover wafer are formed from the bonding side at those areas that correspond in their position with the alignment marks near the edge. The edge-near alignment marks or the alignment marks near the edge are formed in a process for fabricating the structure to be buried, which is formed in the cavity wafer as the first semiconductor wafer. The mask used for the formation of the cavities includes mask elements for these alignment marks such that the front side alignment marks at the edge of the semiconductor wafer and also the structure on the bond side of the first semiconductor wafer are formed by means of this (these) mask(s). Prior to bonding the cover wafer with its bond side to the bond side of the first semiconductor wafer the cover wafer is modified at the edge. This "edge modification" results in a withdrawal or recess of the perimeter or edge.

The recess of the edge of the thinned portion of the cover wafer is a thinning of the cover wafer for generating the edge modification such that in this area the front side alignment marks are again visible after said thinning of the front side (in the vicinity of the edge of the cover wafer). A certain depth and layout geometry are obtained, wherein the entire edge area may be thinned from the bond side as an annular area, or at least a local thinning may be performed which is accomplished by a sort of notching.

A circular area as a recess in the sense of the defined edge modification may be formed during the notching, or a straight edge may be formed that defines a locally restricted area which is thinned. These types of edge modification also referred to as "lowered or recessed regions" are provided for the purpose of exposing the alignment marks at the bond side of the cavity wafer in the sense that a bonding of the cover wafer does not cover them in a two-dimensionally contacting manner, but the bonding provides a cover with vertical distance. If a thinning from the rear side of the cover wafer is performed after the bonding of the two wafers into a wafer stack then the front side alignment marks again become visible by means of the exposure, while at the same time preserving a thinner membrane area that remains as the rest of the cover wafer after the two-dimensional thinning. This membrane covers the cavities as "buried structure" wherein several two-dimensionally distributed cavities or recesses form the "buried structure".

One embodiment concerns a method for aligning, wherein certain method steps occur earlier in the sequence of the method as far as the alignment mark(s) are concerned (temporarily correlated with the formation of at least one alignment mark in the preamble) and wherein the at least one thinning process of the cover wafer is accomplished temporarily prior to the bonding in order to form the at least one edge modification including the withdrawal or recessing of the edge of the thinned part of the cover wafer. Hence, this is accomplished prior to the bonding of the cover wafer modified at the edge on the "first" semiconductor wafer. The at least one edge modification may take on several forms. If the edge modification is locally restricted, a plurality of edge modifications may be provided that are spaced apart from each other and that correspond to the fabricated front side alignment marks. Also, a circumferential thinning may be used as a single edge modification, wherein the withdrawal or recess of the edge has a circular shape. This circular shape does not necessarily need to be aligned azimuthally (circumferentially) with respect to the one or more alignment marks at the front side and in the vicinity of the edge of the first semiconductor wafer. Rather, an alignment of a flattened edge of the wafer (mostly referred to as "main flat") of the cover wafer and the first semiconductor wafer (cavity wafer) is performed such that the alignment of the alignment marks in the thinned circumferential ring area is achieved in a self-aligned manner.

Disclosed is a method for aligning a CMOS structure with respect to a buried structure in particular with respect to at least one cavity of the buried structure, wherein the method steps are provided segmentically. The flow of the method includes at least two first thinning processes that circumferentially correspond to the front side alignment marks. The position of the alignment marks corresponds to the thinned portions of the cover wafer which is due to the fact that these thinned portions are placed such at the bond-related processing that these thinned portions are, for instance, positioned relative to the linear main edge of the cover wafer in the same manner as the front side alignment marks of the cavity wafer (as a first semiconductor wafer) with respect to the main edge also provided there (the secant-like main flat of the otherwise circular wafer). The plurality of alignment marks in another embodiment comprises respective corresponding (several) thinned portions of the wafer thickness of the cover wafer. The plurality of thinned portions may have the same shape which is expressed by multiple uses of one and the same reference sign. The plurality of thinned portions corresponds to the positions of the plurality of alignment marks in the vicinity of the edge of the first semiconductor wafer that is referred to as cavity wafer.

This correspondence can be established such that the thinned portions on the cover wafer are positioned with respect to the flat of the wafer and such that the corresponding positioning for the first semiconductor wafer is also implemented with respect to its main flat. The correspondence of thinned portions with respect to front side alignment marks is then obtained when the main flat of the two wafers are aligned to each other. The "correspondence of alignment marks" as used with respect to the positions of the thinned portions as edge modifications may also be understood with respect to the alignment marks and the thinned portions in a spatial sense.

The certain measure to which the cover wafer is to be thinned from its rear side (second thinning) is determined by the thickness of the membrane that is to cover the cavities of the first semiconductor wafer. It is dependent on the type of sensor to be fabricated.

An embodiment may be understood such that the plurality of thinned portions form a continuous circumferential circular area, or this circular area replaces the several thinned portions. Upon aligning the straight edges of the two wafers (first semiconductor wafer and cover wafer) the alignment marks provided at the edge at the front side may be positioned at any position of the circumferential circular area (as a withdrawal or recess of the cover wafer). The withdrawal or recess is around the entire circumference and relates to the edge or rim of the thinned part of the cover wafer. If several thinned portions are present the withdrawals or recesses are locally restricted and displace or set back the edge of each thinned section of the cover wafer in which the respective thinned portion is present.

A production method is disclosed in which the CMOS structure is incorporated. This structure is positioned with respect to the no longer visible buried structure and is represented by the usage of masks, which form the electronic structure, for instance a resistor, on the remaining membrane of the initial cover wafer. Also in this case, several alignment marks, at least a pair of these front side alignment marks (first group of features) are provided. Accordingly, at least one pair of thinned portions is provided as edge modifications (second feature). This pair is formed in a corresponding manner with respect to the alignment marks. This correspondence may also represent a thinning relative to the alignment mark as well as a thinning relative to a flat edge (of the cover wafer) and an alignment mark relative to the flat edge (of the first semiconductor wafer as a cavity wafer). If the flat edges are aligned to each other the correspondence of each thinned portion to the alignment marks is obtained automatically.

The azimuthal alignment or orientation concerns a circumferentially appropriately rotated positioning of the cover wafer including its edge modification with respect to the present alignment marks on the (first) semiconductor wafer. If several alignment marks are provided, a plurality of (locally restricted) edge modifications may be provided in the cover wafer such that the plurality of positions of this (these) edge modification(s) corresponds to the plurality of alignment marks. However, also an edge modification in the form of a single continuous recess of the edge area (as a thinned circular area) is appropriate for the plurality of alignment marks on the (first) semiconductor wafer. The azimuthal alignment of the cover wafer with respect to the cavity wafer is obtained by the alignment of the straight edges of the wafers to each other.

The disclosed alignment process relates to method steps which are also described in another embodiment, except for the edge modification of the cover wafer being changed prior to its bonding by means of "local recesses in the edge area". The various shapes of the local recesses may be circular, secant-like or ring-shaped, wherein also several different shapes may be mixed, wherein preferably a single type of local recess is used for any local recesses, for instance a continuous exposed ring, or several circumferentially distributed circular thinned portions, or at least one, preferably several, linear edges in the type of a secant.

The embodiments of the invention are advantageous in that the alignment of the front side with respect to the rear side is not necessary, thereby resulting in increased alignment accuracy and thus in increased yield and quality improvement.

A further advantage is the fact that a rear side processing for producing rear side alignment marks is not necessary, thereby reducing the processing efforts and the risk of damaging the front side (the bonding side).

Since the alignment marks are provided at the edge of the wafer advantageously a significantly higher robustness of the assembly is achieved with respect to offset and rotation and also a significantly reduced patterning complexity is achieved, in particular by the withdrawal or recessing of the wafer edge. The claimed invention also avoids patterning-related issues of the type as mentioned above.

One advantageous embodiment of the inventive method is characterized in that the thinned part of the at least one thinned portion of the cover wafer provided from the bond side has the shape of a circle at the edge with a significantly reduced radius compared to the full cover wafer.

The circumference of the cover wafer may also be uniformly thinned which advantageously reduces the probability of stress during the fabrication and handling of the structure.

A further advantageous embodiment of the inventive method is characterized in that the edge of each thinned part of the thinned portion of the cover wafer provided from the bond side has sections of linear edges. In this manner, the alignment of the wafer stack with respect to the masks of the at least one circuit structure to be implemented may be simplified.

A plurality of alignment marks and a plurality of associated—locally restricted—thinned portions may be provided. In particular two thinned portions may be provided. A single thinned portion is formed by a circumferential ring recess. It is not locally restricted and is thus uniformly thinned at the circumference. It may correspond to a plurality of alignment marks.

The invention may be applied in the production process for sensors having a buried geometric structure (for example: an absolute pressure sensor). The invention may also be applied for the fabrication of SOI assemblies or other assemblies formed by wafer bonding with a buried electronic or/and geometric structure and with subsequent alignment of an associated electronic structure.

A structure comprises several elements of a topology; for example, the "buried structure" is characterized by several depressions, or the "electronic CMOS structure" includes several measurement resistors or/and several amplifiers.

In the embodiments of the invention a cover wafer may have a linear section without a thinning from the bond side. The cover wafer receives local flattenings in the vicinity of the edge at positions that correspond in position to the alignment marks. The cover wafer is bonded to the semiconductor wafer in an azimuthal manner after the local flattening, so that the structures are buried while, however, a top view of the alignment marks is still provided after the wafer bonding.

BRIEF DESCRIPTION OF THE DRAWINGS

In order to facilitate a fuller understanding of the present invention, the invention will now be explained using embodiments including two semiconductor wafers while referring to the drawings. In the drawings FIG. 1 illustrates a cavity wafer 11 and a semiconductor wafer and alignment marks 14 at regular positions on the bond side and alignment marks 13 on the rear side of the semiconductor wafer 11 according to the prior art, FIG. 2 illustrates the cover wafer 15 according to the prior art used for hermetically covering the cavities, FIG. 3 illustrates the semiconductor stack 16 bonded in thinned form, wherein the initial thickness of the cover wafer 15 is indicated, according to the prior art, FIG. 4 illustrates the cavity wafer including—according to one embodiment of the invention—alignment marks 7a, 7b formed on the bond side at a position near the edge, FIG. 5 illustrates the cover wafer 5 used for hermetically covering the cavities of FIG. 4, which cover wafer may be thinned in various manners on the bond side at the edge, thereby forming a thickness step according to one embodiment, FIG. 6 illustrates in sectional view the semiconductor stack 6 after the bonding process and after the thinning of the stack consisting of the cover wafer according to FIG. 5 and the cavity wafer according to FIG. 4, and FIG. 7 illustrates the CMOS structure 40h in the wafer stack 6 in appropriate position with respect to the cavity 2h.

DETAILED DESCRIPTION OF EMBODIMENTS

FIGS. 1 to 3 illustrate the approach corresponding to the prior art. The situation on the bond surface 11' of the cavity wafer 11 is illustrated in FIG. 1 as a top view. In this case, the structure 20 consisting of depressions 20a, 20b, 20e and others to be etched into the wafer surface are visible.

Alignment marks 14a, 14b are clearly spaced apart from the wafer edge and are positioned in the vicinity of the edge structure 20. The sectional view of FIG. 1 illustrates alignment marks 13a, 13b on the rear side 11' of the cavity wafer 11, which correspond to the alignment marks 14a, 14b.

Reference signs 12' and 12" indicate a main flattening as a linear edge for both the wafer 11 and the wafer 15.

In FIG. 2 there is shown the non-processed cover wafer 15 used for covering the cavity wafer 11. The surface to be bonded is 15'. Wafers 11 and 15 are bonded. The bonded wafer stack 16 is formed. The stack is shown in FIG. 3 in sectional view—after thinning 15a of the cover wafer 15. The alignment marks 14 (as 14a, 14b) are covered. The alignment marks 13 corresponding to the alignment marks 14 on the rear side of the cavity wafer 11 are used for the alignment of electronic structure(s) (not shown)—on the surface 18' obtained after the thinning of the wafer stack 16, wherein the alignment is performed in spatial relation to the cavities 20. The dotted area 15a on the top side of the stack 16 indicates the material removal of the cover wafer 15 during grinding and polishing. As a result thereof the thinned wafer 18 remains as a membrane having the surface 18'.

FIGS. 4, 5 and 6 explain an embodiment of an inventive approach. The elements for the reference marks 7, which are alignment marks 7a, 7b at the bond surface 1b, are positioned on the bond surface 1b of the cavity wafer 1 (as first semiconductor wafer) in the vicinity of the edge 1a within the masking (the masks).

In FIG. 4 is a top view and illustrates the situation on the bond surface 1b of the cavity wafer 1. Here the structure 2 consisting of the depressions 2a, 2b, ..., 2f, 2g, 2h and others to be etched into the wafer surface are visible. The alignment marks 7a, 7b are positioned at the wafer edge 1a distant from the edge structure 2. Alignment marks 3 corresponding to the alignment marks 7 are missing on the rear side of the cavity wafer.

A main flattening as a linear edge is indicated for the two wafers 1 and 5 by the reference sign 12 (actually two such linear edges 12a and 12b for both wafers, in the following, however, indicated by a single reference sign).

In FIG. 4 rear side marks are not necessary. In the edge area 1a the cover wafer 5 includes one or more recesses as defined edge modifications 9, 10a or 10b. In this one or several portions or areas the front side 1' of the cavity wafer 1 and the alignment marks 7 are visible again after the thinning of the bonded cover wafer.

This is realized by reducing the thickness of the cover wafer 5 in the vicinity of the edge of the bond side 5' with a certain depth in different two-dimensional geometry.

In one case, the entire area of the edge on the bond side may be thinned, the result being characterized by a circular area 9. It is, however, also possible to locally perform a thinning process, for instance by using a kind of indentation, for example as a circular area 10a having a corresponding recessed or withdrawn edge 10a' or as an area 10b delineated by a straight edge or ridge 10b'. All of these variants are illustrated in the same wafer according to FIG. 5, wherein these variants are respective stand-alone variants.

The locally restricted thinned variants cause an azimuthal alignment of the respective thinned areas with respect to the linear leading edges 12a and 12b of the semiconductor wafers (main flat) in order to position the thinned areas 10a, 10b such that they are positioned above the alignment marks 7. The azimuthal alignment of the cover wafer with respect to the cavity wafer 1 is accomplished by aligning the linear edges to each other; or by aligning respective alignment marks to the locally restricted thinned portion. In FIG. 5 the thinned portions or areas 10a, 10b are illustrated in combination with the thinned edge 9. The thinned portions refer to a case without an additional thinned circular area 9. Anything or any combination of these shapes of the edge modifications is, however, possible.

It is within the scope of the embodiments of the invention that also a cover wafer 5 having a linear section may be used without a thinning from the bond side. The edge modification (as local flattening) in this case is a complete separation of a secant section from the cover wafer. This non-illustrated embodiment is readily imaginable by a similar geometry as the main flattening 12, while only being provided at a different position in order to already make visible the associated alignment marks without a thinning from the rear side of the bonded cover wafer. There may be provided a plurality of such secant sections positioned appropriately with respect to the several alignment marks.

A dashed area at the front side of the stack 6 in FIG. 6 indicates the removed portion 5a of the cover wafer 5 during the (second) thinning process after bonding the stack.

After the thinning of the wafer stack 6 according to FIG. 6 including the removal of the part 5a (illustrated in dashed lines) of the cover wafer 5 the electronic structure 40h may be aligned by means of the alignment marks 7 (now again visible) on the surface 8a of the thinned cover wafer in the form of membrane 8, wherein the alignment occurs with respect to the covered cavity structure 2, cf. FIG. 7. The embodiment illustrates the electronic structure 408 above the cavity 2h in an aligned state. The at least one visible alignment mark 7a, 7b made possible the alignment of masks and aligned method steps for fabricating the electronic structure 40h in the surface 8a of the thinned membrane 8.

The invention claimed is:

1. A method of aligning an electronic CMOS structure with respect to a buried structure in a bonded and thinned-back stack of semiconductor wafers comprising the steps of:
    forming at least one alignment mark at an edge portion of a semiconductor wafer in a process of fabricating the buried structure prior to burying it, the structure provided on a front side a semiconductor wafer;
    bonding a cover wafer such that at least one thinned portion that is defined by a recessed edge at a bond side of the cover wafer is provided at a position corresponding to the at least one alignment mark, whereby the cover wafer bonding results in a burying of the buried structures,
    thinning the resulting wafer stack to a certain degree with respect to the cover wafer, making visible the at least one alignment mark; and
    using the alignment mark for aligning masks in fabricating the electronic CMOS structure on the surface of the thinned cover wafer.

2. The method of claim 1, wherein an edge of the thinned portion defines a circle, the radius of the circle being less than a radius of the cover wafer.

3. The method of claim 1, wherein an edge of the thinned portion has a portion with at least one linear edge.

4. The method of claim 1, wherein the forming step comprises forming several alignment marks at the edge portion of the semiconductor wafer.

5. The method of claim 4, wherein the bonding step comprises bonding the cover wafer such that a plurality of thinned portions at the bond side of the cover wafer respectively correspond to one or more of the several alignment marks.

6. The method of claim 1, wherein the buried structure includes a plurality of stand-alone depressions.

7. The method of claim 1, wherein the forming step does not include forming a hole or breakthrough; or wherein the recessed edge is not a hole or a break through of the cover wafer.

8. The method of claim 1, wherein the recessed edge has a circular shape.

9. The method of claim 1, wherein the thinned portions is a single circumferential ring area defined by the recessed edge.

10. A method of fabricating at least one electronic CMOS structure aligned with respect to a structure buried by wafer bonding in a bonded and thinned-back stack of at least two semiconductor wafers, the method comprising:
    during the process of fabricating the structure to be buried, forming at least a pair of alignment marks on a front side of a first semiconductor wafer at a wafer edge of the first semiconductor wafer bearing the structure to be buried;
    bonding the first semiconductor wafer to a cover wafer including thinned portions of the wafer thickness provided at a bond side and in an edge area of the cover waver such that positions of the thinned portions correspond to the positions of the alignment marks, said thinned portions being azimuthally aligned to the alignment marks and extending to the edge of the covered wafer;
    thinning the cover wafer of a wafer stack, the wafer stack obtained by bonding the semiconductor wafers, for forming a thinned cover wafer, wherein the alignment marks at the wafer edge of the first semiconductor wafer become visible;
    using the visible alignment marks for aligning masks in fabricating the electronic structure on a surface of the thinned cover wafer.

11. The method of claim 10, wherein the thinned portions include a plurality of local recesses at the edge area and the boding step comprises bonding the cover wafer such that positions of the plurality of local recesses correspond with positions of the alignment marks and visibility of the alignment marks after the bonding step is obtained.

12. The method of claim 11, wherein the bonding step comprises burying the buried structure in an azimuthally aligned manner based on the areas of the local recesses.

13. The method of claim 10, wherein the thinned portions represent a circumferentially ring shape and the forming step comprises forming a plurality of alignment marks on the first semiconductor wafer.

14. The method of claim 10, wherein the edge area has the shape of a circular area.

15. The method of claim 10, wherein the thinned portions are respectively defined by a thinned, locally restricted area.

16. The method of claim 15, wherein the thinned portions are of local circular shape.

17. The method of claim 15, wherein the thinned portions are local portions having linear edges.

18. A method of aligning an electronic CMOS structure with respect to a buried structure in a bonded and thinned-back stack of semiconductor wafers, comprising the steps
    during a process of fabricating the structure to be buried, alignment marks are formed at a wafer edge on a front side of the semiconductor wafer bearing the structure to be buried, said front side being used for bonding;
    bonding a cover wafer, the cover wafer having local recesses in the edge area at positions that correspond to positions of the alignment marks such that visibility of the alignment marks is obtainable after the wafer bonding, to the semiconductor wafer in an azimuthally aligned manner with respect to the areas of the local recesses, thereby burying the structures and forming a wafer stack, said local recesses extending to the edge of the cover wafer so as to form a thinned edge of the cover wafer;
    thinning the wafer stack with respect to the cover wafer to a certain degree;
    using the alignment marks to align masks in fabricating the electronic CMOS structure on a surface of the thinned cover wafer.

19. A method of fabricating an electronic CMOS structure aligned with respect to a buried structure in a bonded and thinned-back stack of semiconductor wafers, comprising the steps of:
    forming alignment marks at a wafer edge in the process of fabricating the structure to be buried, said alignment marks being formed at a front side used for bonding of the semiconductor wafer bearing the structure to be buried;
    providing a cover wafer, the cover wafer with local flattenings in an edge area at positions that correspond to the positions of the alignment marks, wherein the local flattenings are locally restricted sections having a linear edge and extend through the entire thickness of the cover wafer;
    bonding the cover wafer, being azimuthally aligned with respect to the local flattenings, to the semiconductor wafer, thereby burying the buried structure while visibility of the alignment marks after the wafer bonding and thinning of the cover wafer for forming a membrane is preserved, whereby the visible alignment marks support aligning masks used for fabricating the electronic CMOS structure on a surface of the thinned cover wafer.

* * * * *

UNITED STATES PATENT AND TRADEMARK OFFICE
CERTIFICATE OF CORRECTION

PATENT NO. : 8,691,658 B2  Page 1 of 1
APPLICATION NO. : 13/055884
DATED : April 8, 2014
INVENTOR(S) : Klingner et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 234 days.

Signed and Sealed this
Twenty-ninth Day of September, 2015

Michelle K. Lee
*Director of the United States Patent and Trademark Office*